(12) United States Patent
Nozawa et al.

(10) Patent No.: US 10,932,356 B2
(45) Date of Patent: Feb. 23, 2021

(54) ELECTRONIC EQUIPMENT

(71) Applicant: Sony Interactive Entertainment Inc., Tokyo (JP)

(72) Inventors: Tetsufumi Nozawa, Chiba (JP); Shinya Tsuchida, Tokyo (JP)

(73) Assignee: Sony Interactive Entertainment Inc., Tokyo (JP)

( * ) Notice: Subject to any disclaimer, the term of this patent is extended or adjusted under 35 U.S.C. 154(b) by 0 days.

(21) Appl. No.: 15/902,071

(22) Filed: Feb. 22, 2018

(65) Prior Publication Data

US 2018/0255633 A1   Sep. 6, 2018

(30) Foreign Application Priority Data

Mar. 6, 2017   (JP) .............................. JP2017-041544

(51) Int. Cl.
*H05K 9/00* (2006.01)
*H05K 1/02* (2006.01)
*H01R 12/72* (2011.01)

(52) U.S. Cl.
CPC ......... *H05K 1/0216* (2013.01); *H05K 1/0224* (2013.01); *H05K 9/0026* (2013.01); *H05K 9/0033* (2013.01); *H05K 9/0037* (2013.01); *H05K 9/0039* (2013.01); *H01R 12/724* (2013.01); *H05K 2201/0715* (2013.01);
(Continued)

(58) Field of Classification Search
CPC ...... H05K 9/00; H05K 9/0039; H05K 9/0033; H05K 9/0026; H05K 9/0037
See application file for complete search history.

(56) References Cited

U.S. PATENT DOCUMENTS

| | | | |
|---|---|---|---|
| 5,323,299 A | | 6/1994 | Weber |
| 5,414,597 A | * | 5/1995 | Lindland ............. H05K 9/0037 174/361 |

(Continued)

FOREIGN PATENT DOCUMENTS

| | | |
|---|---|---|
| CN | 1409942 A | 4/2003 |
| JP | 0679198 U | 11/1994 |

(Continued)

OTHER PUBLICATIONS

Notification of Reasons for Refusal for corresponding JP Application No. 2017-041544, 9 pages, dated Jan. 15, 2019.
(Continued)

*Primary Examiner* — Hung V Ngo
(74) *Attorney, Agent, or Firm* — Mattthew B. Dernier, Esq.

(57) ABSTRACT

Electronic equipment includes a printed board having a front surface on which a ground pattern is formed and a shield member disposed opposed to the front surface of the printed board. The shield member has a strip-shaped region that is opposed to the ground pattern and protrudes toward the printed board, and is fastened to the printed board by screws that pass through a respective one of a plurality of screw holes made in the strip-shaped region. Either one of the shield member and the printed board has a protruding part that is formed projectingly toward the other and causes the strip-shaped region and the ground pattern to get contact with each other at a position sandwiched by adjacent two screw holes in the strip-shaped region in plan view.

7 Claims, 11 Drawing Sheets

(52) U.S. Cl.
CPC .............. *H05K 2201/10371* (2013.01); *H05K 2201/10409* (2013.01)

(56) References Cited

U.S. PATENT DOCUMENTS

| | | | | |
|---|---|---|---|---|
| 6,483,719 | B1* | 11/2002 | Bachman | ................ H05K 9/003 174/378 |
| 6,624,432 | B1* | 9/2003 | Gabower | ............. H04B 1/3838 174/384 |
| 6,930,891 | B1* | 8/2005 | Hama | .................. H05K 9/0026 174/359 |
| 7,089,646 | B2* | 8/2006 | Leerkamp | .............. H05K 9/003 174/373 |
| 9,788,467 | B2 | 10/2017 | Shoji | |
| 2017/0034961 | A1 | 2/2017 | Shoji | |
| 2017/0290140 | A1* | 10/2017 | Auger | ................. H05K 1/0216 |

FOREIGN PATENT DOCUMENTS

| | | |
|---|---|---|
| JP | 08222877 A | 8/1996 |
| JP | 10224074 A | 8/1998 |
| JP | 2001085884 A | 3/2001 |
| JP | 2001111283 A | 4/2001 |
| JP | 2013038243 A | 2/2013 |
| JP | 2017028206 A | 2/2017 |

OTHER PUBLICATIONS

Notification of Reasons for Refusal for corresponding JP Application No. 2017-041544, 10 pages, dated Aug. 20, 2019.

Decision of Refusal for corresponding JP Application No. 2017-041544, 10 pages, dated Nov. 26, 2019.

First Office Action for corresponding CN Application No. 201810163676.0, 17 pages, dated Apr. 7, 2020.

* cited by examiner

US 10,932,356 B2

ELECTRONIC EQUIPMENT

BACKGROUND

The present disclosure relates to electronic equipment incorporating a printed board on which plural circuit elements are mounted.

In general, electronic equipment incorporates a printed board on which plural circuit elements are mounted. Among these circuit elements, there is a circuit element that generates an electromagnetic field that becomes noise having an influence on operation, wireless communication, and so forth of other circuit elements. In order to prevent propagation of such noise, covering the circuit element as the generation source of the noise by a shield member formed of a metal plate or the like has been carried out.

SUMMARY

In the case of covering circuit elements on a printed board by a shield member to prevent propagation of noise, the shield member is desired to be grounded by being brought into contact with a ground pattern on the printed board. If the grounding of the shield member is not sufficient, it is difficult to effectively prevent the propagation of noise.

The present disclosure is made in view of the above circumstances and there is a need for the present disclosure to provide electronic equipment that can effectively suppress propagation of noise generated by circuit elements on a printed board at comparatively-low cost.

According to an aspect of the present disclosure, there is provided electronic equipment including a printed board configured to have a front surface on which a ground pattern is formed and a shield member configured to be disposed opposed to the front surface of the printed board. The shield member has a strip-shaped region that is opposed to the ground pattern and protrudes toward the printed board, and is fastened to the printed board by screws that pass through a respective one of a plurality of screw holes made in the strip-shaped region. Either one of the shield member and the printed board has a protruding part that is formed projectingly toward the other and causes the strip-shaped region and the ground pattern to get contact with each other at a position sandwiched by adjacent two screw holes in the strip-shaped region in plan view.

DETAILED DESCRIPTION OF THE PREFERRED EMBODIMENT

An embodiment of the present disclosure will be described in detail below based on the drawings.

Electronic equipment according to one embodiment of the present disclosure is a game machine for home use and includes a printed board (printed wiring board) 10 on which various kinds of circuit elements are mounted and a shield member for preventing propagation of noise generated on the printed board 10. Specifically, the electronic equipment according to the present embodiment includes two shield members, an upper shield member 20 disposed over the front surface (on the upper side) of the printed board 10 and a lower shield member 30 disposed under the back surface (on the lower side) of the printed board 10.

Figure 1:
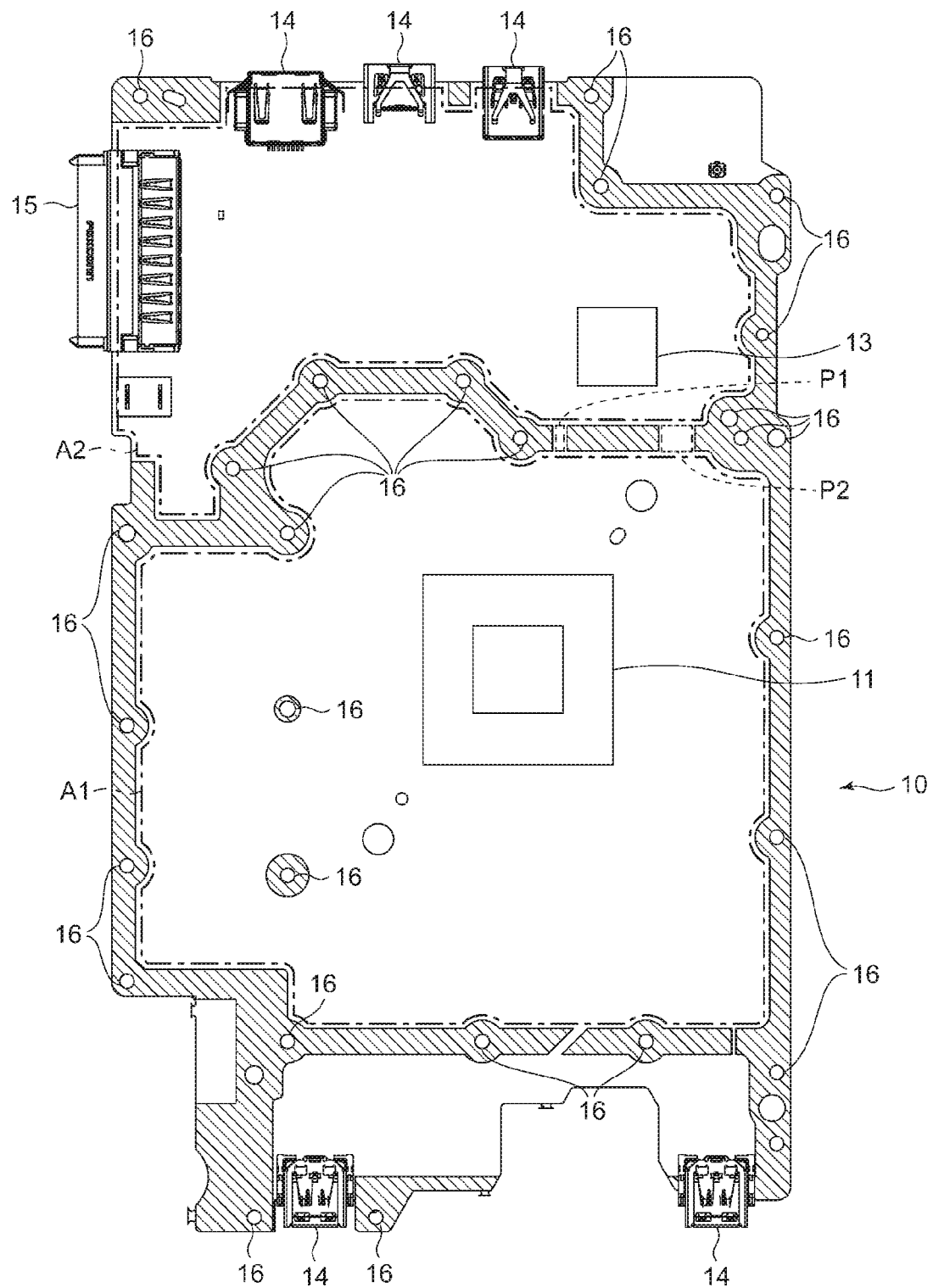
FIG. 1 is a plan view of a printed board incorporated in electronic equipment according to an embodiment of the present disclosure.
Figure 2:
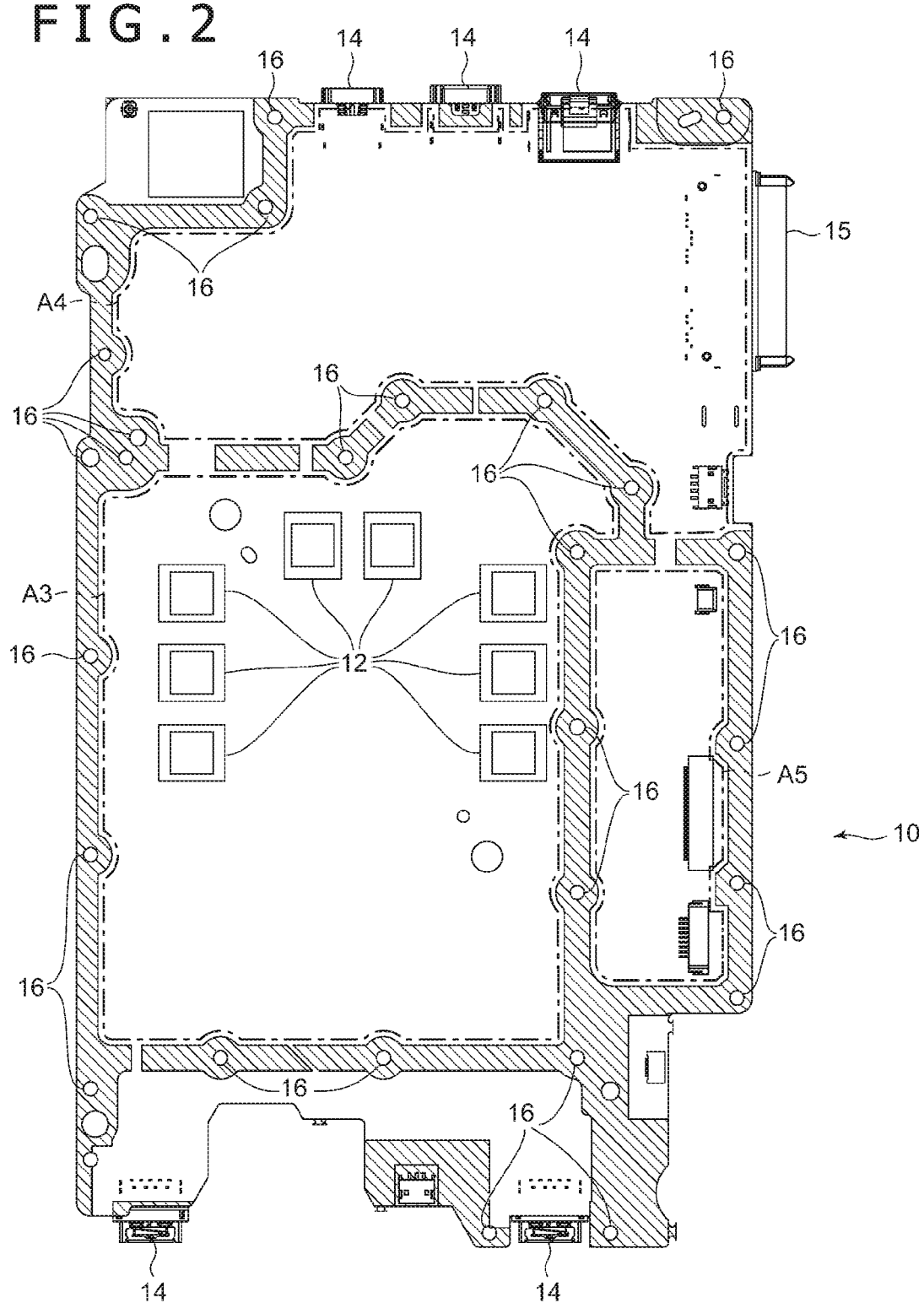
FIG. 2 is a bottom view of the printed board incorporated in the electronic equipment according to the embodiment of the present disclosure.

FIG. 1 is a plan view depicting the appearance of the front surface of the printed board 10 and FIG. 2 is a bottom view depicting the appearance of the back surface of the printed board 10. As depicted in these diagrams, various kinds of circuit elements are each mounted on the front surface and the back surface of the printed board 10 in the present embodiment. Specifically, a system-on-a-chip (SoC) 11 is disposed on the front surface of the printed board 10 and plural memory elements 12 are disposed on the back surface. Besides, an integrated circuit 13 is disposed on the front surface of the printed board 10. Furthermore, at the outer circumferential part of the printed board 10, plural connectors 14 that each serve as an interface for connecting the electronic equipment to external equipment are disposed. Moreover, a connector 15 for built-in equipment for connecting peripheral equipment incorporated in the electronic equipment is also mounted. Although description is omitted here, various kinds of circuit elements besides them are also mounted on the printed board 10.

The SoC 11 is an integrated circuit that executes central arithmetic processing for implementing functions of the electronic equipment according to the present embodiment. In the present embodiment, the SoC 11 executes not only general information processing but also rendering processing of images. The memory elements 12 are semiconductor elements that store data treated as a target of processing by the SoC 11. Suppose that here the memory elements 12 are memory chips in conformity with a standard of the Graphics Double Data Rate (GDDR). In the present embodiment, among the various kinds of circuit elements mounted on the printed board 10, these SoC 11 and memory elements 12 generate comparatively-strong noise. For this reason, a noise countermeasure is desired to be taken to prevent the noise from affecting the other circuit elements and so forth.

The integrated circuit 13 executes processing relating to interface control and so forth. Compared with the SoC 11 and the memory elements 12, noise generated by this integrated circuit 13 is weak. However, possibly the noise also affects wireless communication and so forth carried out by the electronic equipment and it is preferable to take a noise countermeasure. The plural connectors 14 are each an interface for communication connection of the electronic equipment with external equipment in a wired manner and may be connectors according to a standard of universal serial bus (USB), high-definition multimedia interface (HDMI) (registered trademark), Ethernet (registered trademark), or the like. The connector 15 for built-in equipment is an interface for connecting a hard disk drive incorporated in the electronic equipment.

On the front surface and the back surface of the printed board 10, ground patterns that become the reference potential of the electronic circuit on the printed board 10 are formed. In FIG. 1 and FIG. 2, the ground patterns are depicted by hatching. In the present embodiment, the ground pattern is formed into a substantially strip shape except for partial places, and the front surface and the back surface of the printed board 10 are each divided into plural areas by this ground pattern. Specifically, an area A1 and an area A2 are formed in the front surface of the printed board 10. The SoC 11 is disposed in the area A1 and the integrated circuit 13, part of the connectors 14, and the connector 15 for built-in equipment are disposed in the area A2. Furthermore, an area A3, an area A4, and an area A5 are formed in the back surface of the printed board 10. Eight memory elements 12 are disposed in the area A3 and various kinds of circuit elements are disposed also in the area A4 and the area A5.

In the present embodiment, for each of these plural areas, a noise countermeasure of carrying out control to prevent noise generated in the area from propagating to the external of the area is implemented. Such a noise countermeasure is implemented by the upper shield member 20 and the lower shield member 30. The upper shield member 20 and the lower shield member 30 are both manufactured through molding of an electrically-conductive metal plate and have plural recessed parts. These shield members can be each manufactured by carrying out shaping processing such as drawing on one metal plate.

Figure 3:
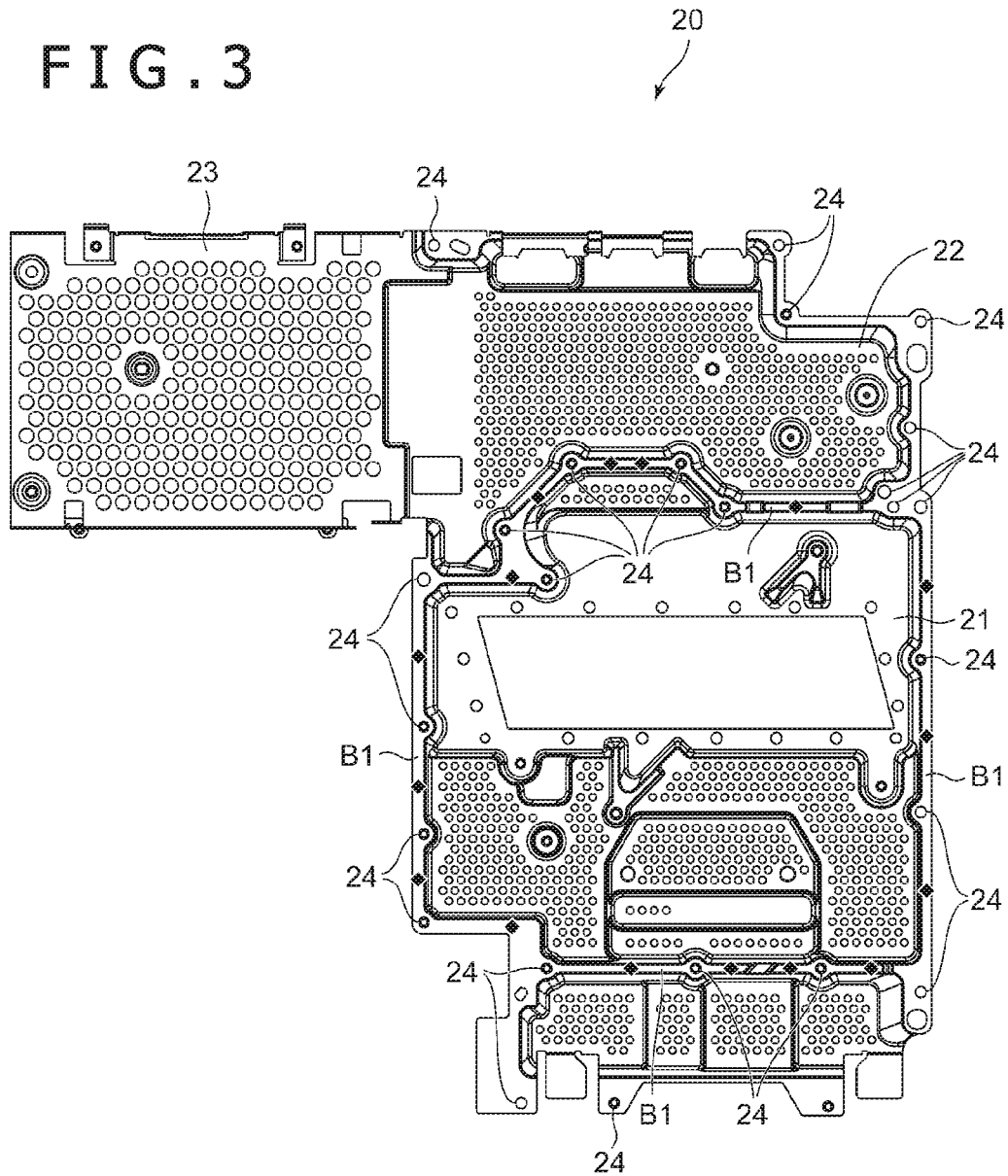
FIG. 3 is a plan view of an upper shield member.
Figure 4:
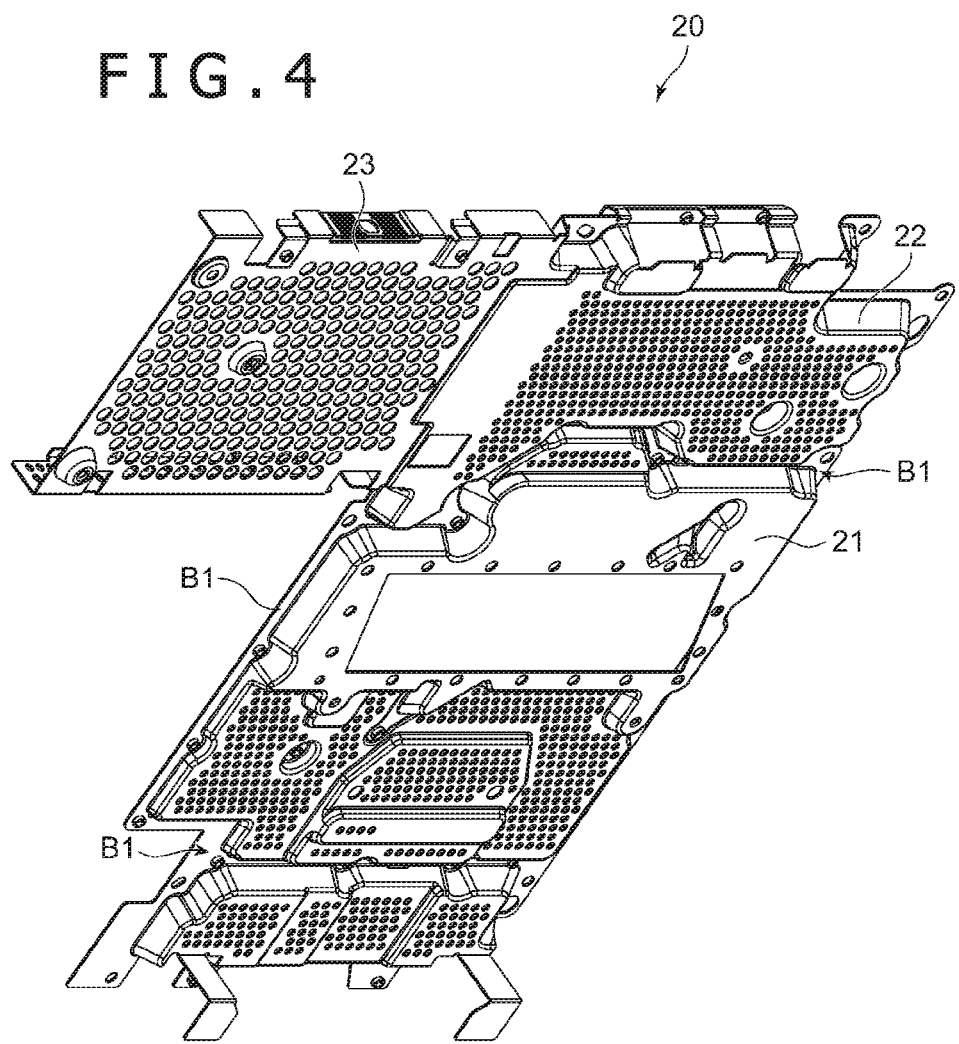
FIG. 4 is a perspective view of the upper shield member.

FIG. 3 is a plan view depicting the surface of the upper shield member 20 on the opposite side to the surface opposed to the printed board 10 and FIG. 4 is a perspective view as seen from the upper side. The upper shield member 20 is disposed opposed to the front surface of the printed board 10. As depicted in these diagrams, the upper shield member 20 has a first part 21, a second part 22, and a non-opposed part 23. Specifically, the upper shield member 20 has a strip-shaped region B1 that protrudes toward the printed board 10 along boundary lines of the first part 21, the second part 22, and the non-opposed part 23. Furthermore, the strip-shaped region B1 is formed not only at boundary parts sandwiched by the first part 21, the second part 22, and the non-opposed part 23 but also at positions along at least part of the outer circumferences of these parts. Most part of this strip-shaped region B1 is formed at positions opposed to the ground pattern formed on the front surface of the printed board 10 and the surface on the side of the printed board 10 is formed substantially flatly except for protruding parts 26 to be described later.

In both the first part 21 and the second part 22, the surface on the side opposed to the printed board 10 is formed into a substantially recessed shape due to surrounding by the above-described strip-shaped region B1. When the upper shield member 20 is attached to the printed board 10, the first part 21 is opposed to the area A1 in the front surface of the printed board 10 and the second part 22 is opposed to the area A2. The recessed parts formed in the first part 21 and the second part 22 each form a space with the front surface of the printed board 10, which can house the circuit elements disposed in the area A1 and the area A2 in the respective spaces. Furthermore, the non-opposed part 23 is a part that is not opposed to the printed board 10 and functions as a case that houses a hard disk drive connected to the printed board 10.

The first part 21 covers the area A1, in which the SoC 11 and other circuit elements are disposed, and thereby suppresses propagation of noise generated from these circuit elements and through-holes and so forth in the area A1 to the external. Similarly, the second part 22 covers the area A2 and thereby suppresses propagation of noise generated from the circuit elements such as the integrated circuit 13 disposed on the area A2 and through-holes and so forth in the area A2 to the external. The principle of prevention of noise propagation in the present embodiment will be described later.

Figure 5:
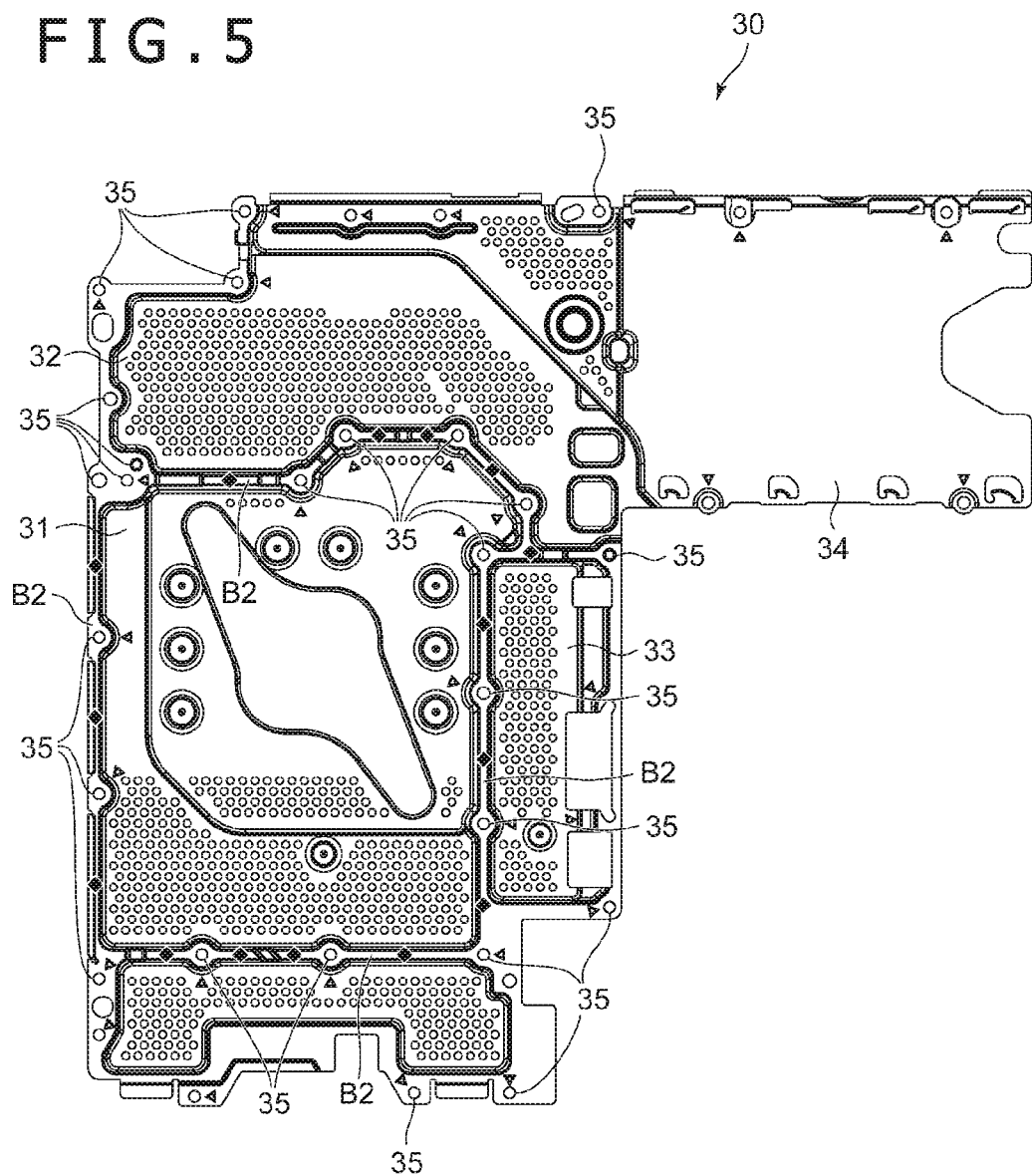
FIG. 5 is a bottom view of a lower shield member.
Figure 6:
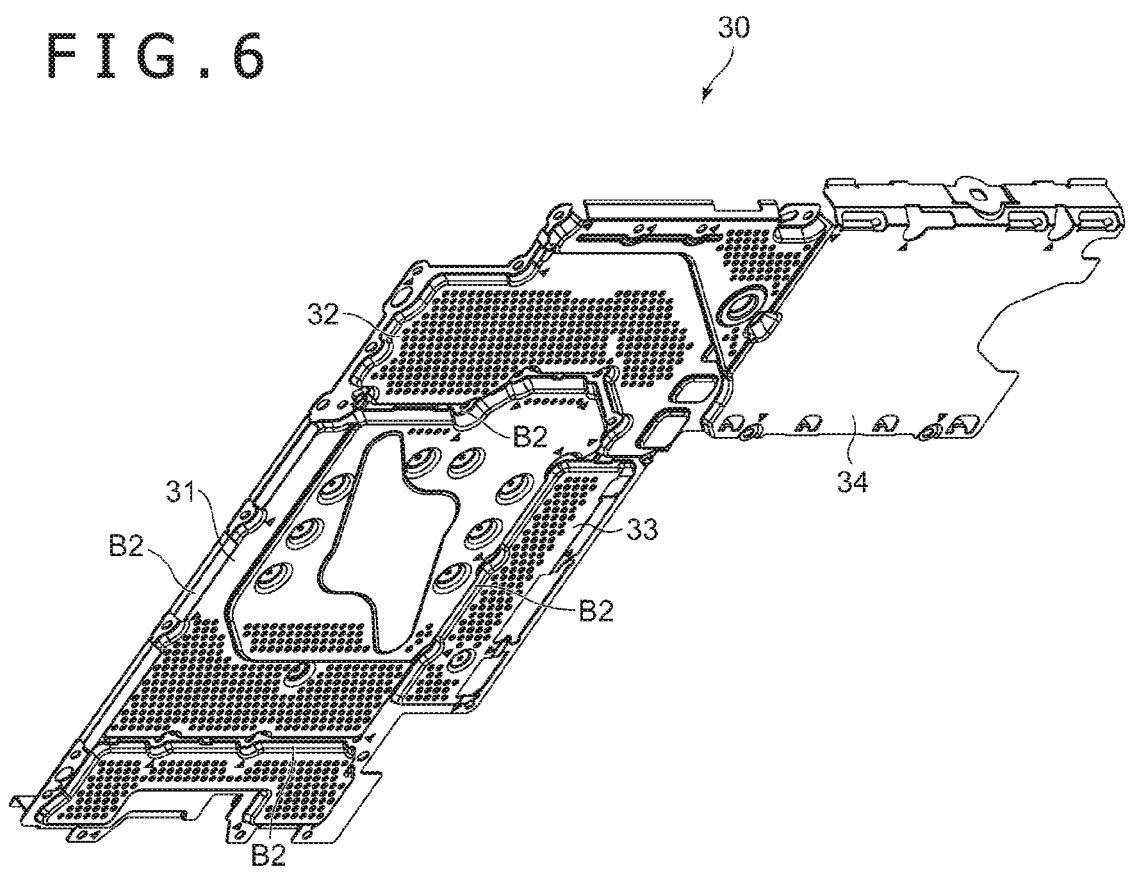
FIG. 6 is a perspective view of the lower shield member.

FIG. 5 is a bottom view depicting the surface of the lower shield member 30 on the opposite side to the surface opposed to the printed board 10 and FIG. 6 is a perspective view as seen from the lower side. The lower shield member 30 is disposed opposed to the back surface of the printed board 10. As depicted in these diagrams, the lower shield member 30 has a third part 31, a fourth part 32, a fifth part 33, and a non-opposed part 34. Specifically, the lower shield member 30 has a strip-shaped region B2 that protrudes toward the printed board 10 along boundary lines of the third part 31, the fourth part 32, the fifth part 33, and the non-opposed part 34. Furthermore, the strip-shaped region B2 is formed not only at boundary parts sandwiched by the third part 31, the fourth part 32, the fifth part 33, and the non-opposed part 34 but also at positions along at least part of the outer circumferences of these parts. Most part of this strip-shaped region B2 is formed at positions opposed to the ground pattern formed on the back surface of the printed board 10 and the surface on the side of the printed board 10 is formed substantially flatly except for protruding parts 36 to be described later.

In all of the third part 31, the fourth part 32, and the fifth part 33, the surface on the side opposed to the printed board 10 is formed into a substantially recessed shape due to surrounding by the above-described strip-shaped region B2. When the lower shield member 30 is attached to the printed board 10, the third part 31 is opposed to the area A3 in the back surface of the printed board 10 and the fourth part 32 is opposed to the area A4 and the fifth part 33 is opposed to the area A5. The recessed parts formed in the third part 31, the fourth part 32, and the fifth part 33 each form a space with the back surface of the printed board 10, which can house the circuit elements disposed in the area A3, the area A4, and the area A5 in the respective spaces. Furthermore, the non-opposed part 34 is a part that is not opposed to the printed board 10 and houses a hard disk drive with the non-opposed part 23 of the upper shield member 20.

The third part 31 covers the area A3, in which the plural memory elements 12 and other circuit elements are disposed, and thereby suppresses propagation of noise generated from these circuit elements and so forth to the external. Similarly, the fourth part 32 and the fifth part 33 cover the area A4 and the area A5, respectively, and suppress propagation of noise generated in the inside thereof to the external.

Figure 7:
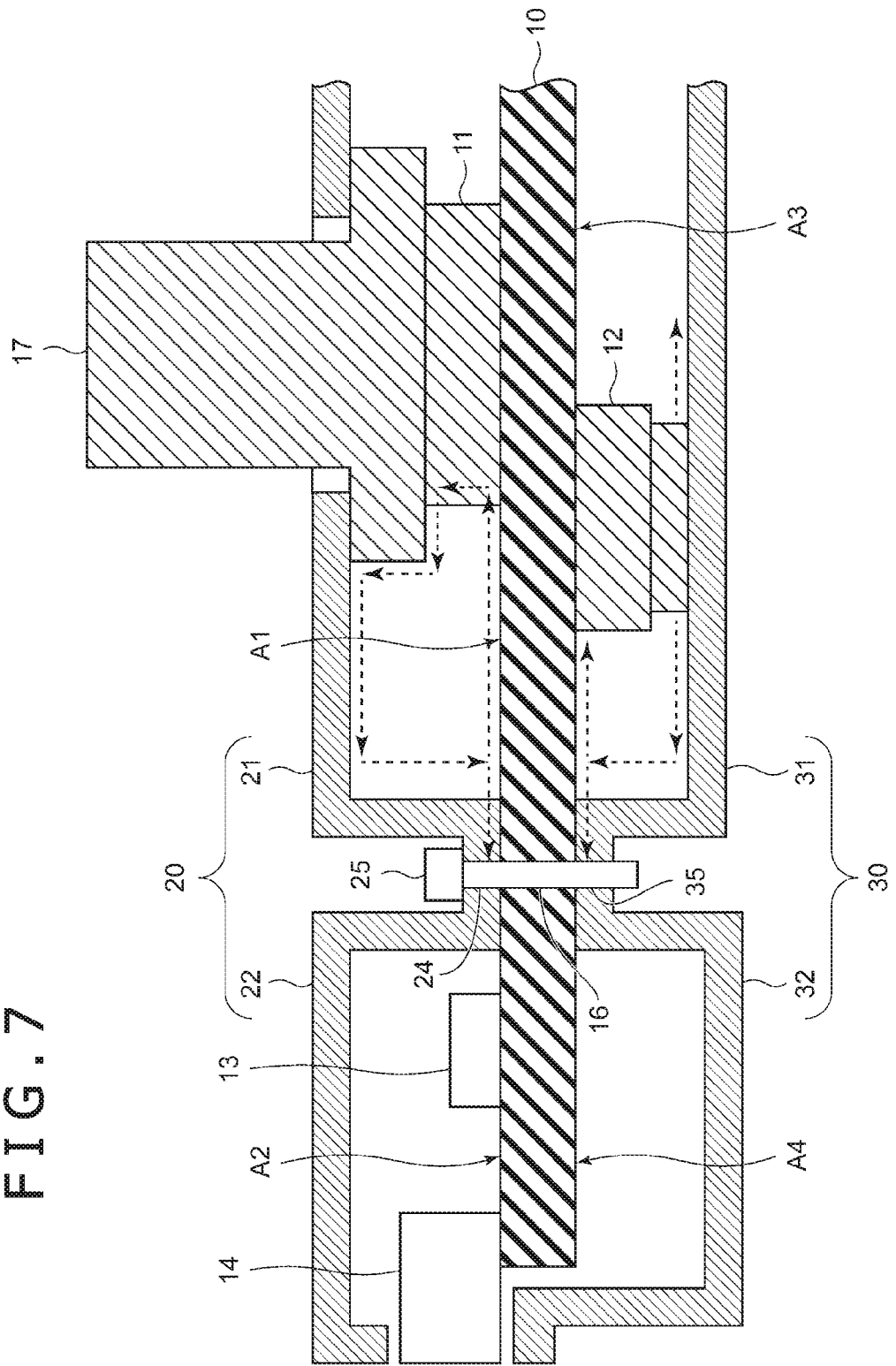
FIG. 7 is a diagram for explaining the principle of prevention of noise propagation in the embodiment of the present disclosure.

The principle of prevention of noise propagation in the present embodiment will be described below by using FIG. 7. FIG. 7 is a partial sectional view schematically depicting appearance when the printed board 10 to which the upper shield member 20 and the lower shield member 30 are fixed is cut along a direction that is perpendicular to the front surface of the printed board 10 and is perpendicular to the extension direction of the ground pattern formed on the front surface. For convenience of description, only major components are represented in FIG. 7 and the size and position of each component are different from the actual size and position.

As depicted in FIG. 7, the upper shield member 20 is electrically connected to the ground pattern of the printed board 10 along the boundary part between the first part 21 and the second part 22 (i.e. part sandwiched by the first part 21 and the second part 22). Specifically, as depicted in FIG. 1 and FIG. 2, plural screw holes 16 are made in the ground pattern of the printed board 10. Furthermore, as depicted in FIG. 3, plural screw holes 24 are made in the strip-shaped region B1 surrounding each of parts including the first part 21 and the second part 22 in the upper shield member 20. As exemplified in FIG. 7, the upper shield member 20 is fastened to the printed board 10 by a screw 25 through the screw hole 24 of the upper shield member 20 and the screw hole 16 of the printed board 10. Due to this, the upper shield member 20 is fixed to the printed board 10 and the strip-shaped region B1 surrounding the first part 21 and the second part 22 is electrically connected to the ground pattern of the printed board 10.

In particular, the boundary part between the first part 21 and the second part 22 is electrically connected to the ground pattern disposed between the area A1 and the area A2 on the printed board 10. Due to this, as depicted by dashed arrows in FIG. 7, noise generated from the SoC 11 and so forth is blocked at the position of the connection to the ground pattern. As above, in the electronic equipment according to the present embodiment, noise can be suppressed to prevent mutual noise propagation between the first part 21 and the second part 22 although the first part 21 and the second part 22 are formed of the same one metal plate. That is, with only the upper shield member 20 formed of the one metal plate, a noise countermeasure can be implemented for each of areas including the area A1 and the area A2 individually.

As described above, in the present embodiment, particularly noise generated by the SoC 11 in the area A1 is comparatively strong and noise generated by the circuit elements such as the integrated circuit 13 in the area A2 is comparatively weak. For this reason, a difference exists in the desired noise suppression capability between the first part 21 and the second part 22. Specifically, the first part 21 is desired to have comparatively-strong noise suppression capability and therefore it is preferable that a large hole be not made. Although a large opening exists in the first part 21 as depicted in FIG. 3, this opening is for disposing a heat sink 17 for cooling the SoC 11 and is closed by the heat sink 17 as depicted in FIG. 7.

On the other hand, as for the second part 22, noise suppression capability comparable to that of the first part 21 is not desired. For this reason, the second part 22 is not desired to have a structure that completely covers the circuit elements in the area A2 and making a hole with a size larger than a certain size is also permitted. Furthermore, because the plural connectors 14 and the connector 15 for built-in equipment are disposed in the area A2, the side surface of the second part 22 is opened at the disposing positions of them and the second part 22 does not form a complete recessed part as a whole. Due to the suppressing noise propagation by each of parts including the first part 21 and the second part 22 individually, design in which such openings are made is enabled. As above, according to the electronic equipment in accordance with the present embodiment, the level of the noise countermeasure can be made different for each area as the unit of the noise countermeasure.

Because of the circuit design, it is difficult to completely isolate the area A1 and the area A2 by the ground pattern and pattern interconnects that couple the circuit elements in the area A1 and the circuit elements in the area A2 are disposed. Specifically, as depicted in FIG. 1, the ground pattern gets discontinuous at positions P1 and P2 and the area A1 and the area A2 are connected by pattern interconnects that pass through these positions P1 and P2. For this reason, possibly these positions P1 and P2 become a path that propagates noise. Accordingly, the screw hole 16 is made at a position that exists in the ground pattern and is as close to these positions P1 and P2 as possible and the upper shield member 20 is connected to the ground pattern at the position. This can suppress propagation of noise. Furthermore, it is also preferable to make the screw holes 16 on both sides of each of the positions P1 and P2 and connect the upper shield member 20 to the ground pattern on both sides.

Also regarding the lower shield member 30, as depicted in FIG. 5, screw holes 35 are made in the strip-shaped region B2 surrounding each of parts including the third part 31, the fourth part 32, and the fifth part 33. As exemplified in FIG. 7, the lower shield member 30 is fastened to the printed board 10 by the screw 25 through this screw hole 35 and the screw hole 16 made in the ground pattern of the printed board 10. Due to this, the lower shield member 30 is fixed to the printed board 10 and the strip-shaped region B2 surrounding the third part 31, the fourth part 32, and the fifth part 33 is electrically connected to the ground pattern of the printed board 10. In particular, due to electrical connection of the boundary part between the third part 31 and another part to the ground pattern of the printed board 10, propagation of noise generated from the memory elements 12 and so forth disposed in the third part 31 to the other part can be suppressed. Furthermore, also regarding the fourth part 32 and the fifth part 33, propagation of noise generated in the inside thereof to the external can be suppressed. That is, with only the lower shield member 30 formed of one metal plate, a noise countermeasure can be implemented for each of areas including the area A3, the area A4, and the area A5 individually.

Also regarding the back surface of the printed board 10, noise generated from the memory elements 12 in the area A3 is comparatively strong and noise generated in the other regions is comparatively weak. For this reason, the third part 31 opposed to the area A3 can be designed to have strong noise suppression capability and the other parts can be designed to have comparatively-low noise suppression capability.

As is apparent from FIG. 1 and FIG. 2, the positions of the ground pattern on the front surface of the printed board 10 and the ground pattern on the back surface overlap with each other in plan view in a partial region (that is, the ground patterns exist at the same position between the front and back surfaces), whereas a region in which the ground pattern is formed only on either one surface also exists. Due to this, the front surface and the back surface are different also regarding the number and shape of areas as the unit of the noise countermeasure. As above, the number and shape of areas may be made different between the front surface and the back surface of the printed board 10 depending on the convenience of the circuit arrangement design on the printed board 10, and so forth.

Meanwhile, in the region in which the ground patterns overlap between the front surface and the back surface, the upper shield member 20 and the lower shield member 30 can be co-fastened by one screw 25 as depicted in FIG. 7. As a concrete example, the strip-shaped region B1 at the boundary between the first part 21 and the second part 22 in the upper shield member 20, the ground pattern between the area A1 and the area A2 in the front surface of the printed board 10, the ground pattern between the area A3 and the area A4 in the back surface of the printed board 10, and the strip-shaped region B2 at the boundary between the third part 31 and the fourth part 32 in the lower shield member 30 have overlapping regions that all overlap with each other in plan view. A screw hole is made in such an overlapping region of each of members including the upper shield member 20, the printed board 10, and the lower shield member 30 and all members are co-fastened by one screw 25. This can electrically connect both the upper shield member 20 and the lower shield member 30 to the ground patterns of the printed board 10 by one screw 25. By increasing the number of positions at which such co-fastening is possible, the electrical connection of the upper shield member 20 and the lower shield member 30 to the printed board 10 can be implemented by a smaller number of screws. Depending on the position, only the upper shield member 20 and the lower shield member 30 may be screwed without the intermediary of the printed board 10.

Moreover, in the present embodiment, in order to enhance the noise blocking effect, plural protruding parts 26 that project toward the printed board 10 are formed in the strip-shaped region B1 of the upper shield member 20. Specifically, when attention is paid to two screw holes 24 formed adjacently in the strip-shaped region B1 in plan view, this protruding part 26 is formed at a position sandwiched between these screw holes 24. As described above, the strip-shaped region B1 has a shape that protrudes toward the printed board 10 so as to get contact with the ground pattern of the printed board 10. However, it is difficult to form the strip-shaped region B1 in such a manner that the whole surface thereof gets close contact with the ground pattern. For this reason, although the upper shield member 20 is electrically connected to the ground pattern surely at the place where the upper shield member 20 is fastened to the printed board 10 by the screw 25, the upper shield member 20 is not in complete contact with the ground pattern at the other place and possibly noise propagates from such a position. It is also conceivable that the places of joining to the printed board 10 by the screw 25 are increased in order to prevent such noise leakage. However, the increase in the places of screwing causes increase in the manufacturing cost. Accordingly, in the present embodiment, by forming the protruding part 26 at the position sandwiched between two screw holes 24, this protruding part 26 is surely brought into contact with the ground pattern. This can further suppress propagation of noise to the external of the area compared with the case in which the protruding part 26 is not formed.

Also regarding the lower shield member 30, plural protruding parts 36 that project toward the printed board 10 are formed in the strip-shaped region B2 similarly. Each of these protruding parts 36 is formed at a position sandwiched between two screw holes 35 in the strip-shaped region B2 and prevents noise from propagating from the position between the two screw holes 35 to the external of the area. Although characteristics of the protruding part 26 formed in the strip-shaped region B1 of the upper shield member 20 will be described below, these characteristics may be similarly applied also to the protruding part 36 formed in the strip-shaped region B2 of the lower shield member 30.

Figure 8:
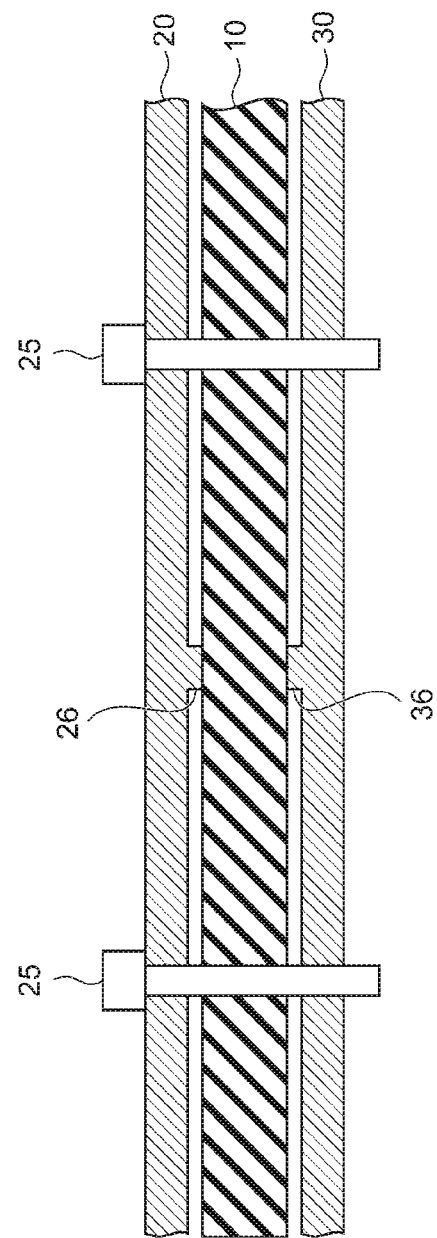
FIG. 8 is a diagram for explaining the structure of protruding parts provided in the shield members.

FIG. 8 is a diagram depicting the state in which the protruding part 26 formed in the strip-shaped region B1 is electrically connected to the ground pattern, and is a partial sectional view schematically depicting appearance when the printed board 10 to which the upper shield member 20 and the lower shield member 30 are fixed is cut along a direction that is perpendicular to the front surface of the printed board 10 and is parallel to the extension direction of the ground pattern. Similarly to FIG. 7, the size and position of each component are different from the actual size and position also in this FIG. 8. As depicted in this diagram, by providing the protruding part 26 between two screw holes 24, the upper shield member 20 can be surely brought into contact with the ground pattern of the printed board 10 not only at the positions of the screw holes 24 but also at the position of this protruding part 26.

Furthermore, in the example of this FIG. 8, the respective protruding parts are disposed in such a manner that the position at which the protruding part 26 provided in the upper shield member 20 gets contact with the printed board 10 and the position at which the protruding part 36 provided in the lower shield member 30 gets contact with the printed board 10 overlap with each other in plan view. This can avoid imbalance of the pressure applied to the printed board 10 due to the respective protruding parts compared with the case in which the positions of the protruding part 26 and the protruding part 36 are shifted from each other.

Hereinafter, the positions of the screw holes 24 and the protruding parts 26 for surely bringing the upper shield member 20 into contact with the ground pattern will be referred to as contact points collectively and the distance between two contact points adjacent in the strip-shaped region B1 in plan view will be referred to as inter-contact-point distance. It is preferable that plural protruding parts 26 be disposed in such a manner that the inter-contact-point distance is set as short as possible. This is because, when the inter-contact-point distance becomes longer, the possibility of leakage of noise from the place becomes higher. For this reason, in the case of disposing one protruding part 26 between two screw holes 24, it is preferable to dispose the protruding part 26 at substantially the center of the interval between the two screw holes 24.

Specifically, it is preferable to decide the inter-contact-point distance in consideration of the wavelength of noise as a matter. For example, if noise of a frequency band of 5 GHz used in wireless communication is particularly desired to be suppressed, the positions of contact points are decided in such a manner that the inter-contact-point distance is shorter than the half-wavelength of the wavelength corresponding to such a frequency. The inventors of the present application have confirmed that propagation of noise of a frequency corresponding to a wavelength λ can be effectively prevented by setting the inter-contact-point distance shorter than ⅓ λ, preferably shorter than ¼ λ, as the result of experiment. Because the wavelength k corresponding to the frequency of 5 GHz is approximately 60 mm, propagation of noise that affects the 5-GHz band can be effectively prevented by setting the inter-contact-point distance shorter than 20 mm (=⅓ λ), preferably shorter than 15 mm (=¼ λ).

On the other hand, if a large number of protruding parts 26 are provided between two screw holes 24, although the inter-contact-point distance can be set short, it becomes difficult to surely bring all protruding parts 26 into contact with the ground pattern because of a matter of the accuracy at the time of manufacturing. For this reason, it is preferable to set the number of protruding parts 26 disposed between adjacent two screw holes 24 to one or at most up to two. As described above, places at which the ground pattern is divided in order to dispose pattern interconnects exist (positions P1 and P2 and so forth) on the boundary line that separates plural areas of the printed board 10. At such a place, the protruding parts 26 are provided on both sides of this dividing place. This makes noise propagate to the external less readily.

In FIG. 3 and FIG. 5, concrete examples of the positions of the protruding parts 26 and 36 disposed in consideration of the above-described condition are depicted by black rhombus marks. In the example of these diagrams, particularly an example of the case in which the protruding parts are provided in the strip-shaped region B1 surrounding the first part 21 of the upper shield member 20 and the strip-shaped region B2 surrounding the third part 31 of the lower shield member 30 is depicted.

When a metal plate is subjected to molding processing to mold the upper shield member 20, the protruding parts 26 can be formed together. The shape of the protruding part 26 is not particularly limited. However, if the surface of the protruding part 26 on the side of the printed board 10 is formed to be flat and have a large width, possibly the intended place does not get contact with the ground pattern. For example, if the length of the protruding part 26 along the extension direction of the strip-shaped region B1 is set long, it becomes difficult to bring the whole of the protruding part 26 into contact with the ground pattern and there is a possibility that the protruding part 26 gets contact with the ground pattern at a position of either the left or right end part. In this case, even when the protruding part 26 is disposed at substantially the center of the interval between adjacent two screw holes 24, the contact place between the protruding part 26 and the ground pattern is biased toward the side closer to either screw hole 24 and the inter-contact-point distance to the screw hole 24 on the opposite side becomes long. Thus, it is preferable that the length of the protruding part 26 along the extension direction of the strip-shaped region B1 be set short in order to surely control the position of the contact of the protruding part 26 to the ground pattern. Specifically, it is preferable to set the length of the protruding part 26 along the extension direction of the strip-shaped region B1 to 3 mm or shorter.

Furthermore, instead of forming the protruding part 26 by molding the metal plate itself that forms the upper shield member 20, a member separate from the main body of the upper shield member 20 may be employed as the protruding part 26. In this case, the protruding part 26 is formed by causing a member having electrical conductivity to adhere to the upper shield member 20. As a concrete example, the protruding part 26 may be solder caused to adhere to the strip-shaped region B1 by soldering. Alternatively, the protruding part 26 may be an electrically-conductive tape, an electrically-conductive adhesive, a copper foil tape, an on-board contact, a gasket formed of an electrically-conductive fabric, or the like, caused to adhere to the strip-shaped region B1. Furthermore, the protruding part 26 may be formed based on a combination of these materials.

As described above, according to the electronic equipment in accordance with the present embodiment, a noise countermeasure can be implemented for each of plural areas in the front surface of the printed board 10 independently by a single shield member formed from one metal plate. Furthermore, it is also possible to make the level of the noise countermeasure different on each area basis. For this reason, the number of components can be reduced and the assembly step can be simplified compared with the case in which noise countermeasures are implemented for the respective areas by different shield members. Furthermore, the manufacturing cost can be lowered. Moreover, compared with the case in which the shield is formed into a double structure, the thickness of the whole of the printed board to which the shield is fixed can be reduced and thus the whole of the electronic equipment can be reduced in size and weight. Furthermore, by finely compartmentalizing one shield member on each area basis by drawing or the like, components housed in the compartments can be protected from shock.

Moreover, by providing the protruding parts in the strip-shaped region of each shield member opposed to the ground pattern of the printed board 10, each shield member can be surely brought into contact with the ground pattern and the noise blocking effect can be enhanced.

The embodiment of the present disclosure is not limited to the embodiment described above. For example, the kinds, numbers, disposing positions, and so forth of the circuit elements mounted on the printed board 10 are not limited to those described above. Similarly, the number and shape of areas as the unit of the noise countermeasure are also not limited to those described above and may be various numbers and shapes. Furthermore, as the method for electrically connecting the upper shield member 20 and the lower shield member 30 to the ground pattern of the printed board 10, the respective shield members are fastened by screws through screw holes in the ground pattern in the above description. However, the respective shield members may be fastened to the printed board 10 by another fastening member. Moreover, the respective shield members may be electrically connected by another method.

Furthermore, the upper shield member 20 and the lower shield member 30 are composed of plural parts separated from each other by the strip-shaped region in the above description. However, the configuration is not limited thereto and the above-described techniques can be applied also when a noise countermeasure is carried out for the whole of the front surface of the printed board 10 or one area that occupies one part by a single shield member. That is, in the case of deeming one area as the target and preventing propagation of noise generated in the area to the external, a ground pattern is formed along the outer circumference of the area. Furthermore, a strip-shaped region is formed in the shield member in such a manner as to be opposed to the ground pattern. The strip-shaped region in this case may be a region formed along the outer circumference of the shield member for example. In this strip-shaped region, a protruding part that projects toward the printed board 10 is formed at a position sandwiched by two screw holes. Due to this, the shield member is electrically connected to the ground pattern of the printed board 10 by the places of the screwing and the protruding part and propagation of noise to the external of the area can be prevented.

In the above description, each shield member is provided with the protruding parts formed to project toward the printed board 10 in order to bring each shield member into contact with the ground pattern of the printed board 10. However, the configuration is not limited thereto and each shield member may be brought into contact with the ground pattern of the printed board 10 by protruding parts provided on the side of the printed board 10. Such a modification example will be described below.

In this modification example, in the ground pattern on the front surface of the printed board 10, protruding parts 18 are disposed at positions opposed to the strip-shaped region B1 of the upper shield member 20. These protruding parts 18 are formed to protrude toward the upper shield member 20 by using electrically-conductive members. When the upper shield member 20 is screwed to the printed board 10, the protruding parts 18 get contact with the strip-shaped region B1 of the upper shield member 20. Due to this, the ground pattern of the printed board 10 and the strip-shaped region B1 of the upper shield member 20 are electrically connected also at the disposing positions of the protruding parts 18 in addition to the positions at which the upper shield member 20 is screwed to the printed board 10.

The protruding part 18 may have characteristics similar to those of the protruding part 26 in the above-described case in which the protruding parts 26 are provided on the upper shield member 20. For example, it is preferable that the length of the protruding part 18 along the extension direction of the strip-shaped region B1 be set to 3 mm or shorter. Furthermore, it is preferable to dispose the protruding parts 18 in such a manner that, in plan view, the distance between adjacent contact points (position of screwing and the position of the protruding part 18) is shorter than ⅓ λ, with respect to the wavelength λ, of noise as a matter (shorter than 20 mm when noise of a frequency of 5 GHz is treated as the subject), preferably shorter than ¼ λ, (shorter than 15 mm when noise of a frequency of 5 GHz is treated as the subject).

The protruding part 18 may be formed of solder, an electrically-conductive tape, an electrically-conductive adhesive, a copper foil tape, an on-board contact, a gasket formed of an electrically-conductive fabric, or the like similarly to the above-described protruding part 26.

Similarly, in the ground pattern on the back surface of the printed board 10, protruding parts 19 are disposed at positions opposed to the strip-shaped region B2 of the lower shield member 30. These protruding parts 19 are also formed to protrude toward the lower shield member 30 by using electrically-conductive members similarly to the protruding parts 18. Due to these protruding parts 19, the ground pattern on the back surface of the printed board 10 is allowed to surely get contact with the strip-shaped region B2 of the lower shield member 30. The shape and disposing position of this protruding part 19 may also have characteristics similar to those of the protruding part 18.

Figure 9:
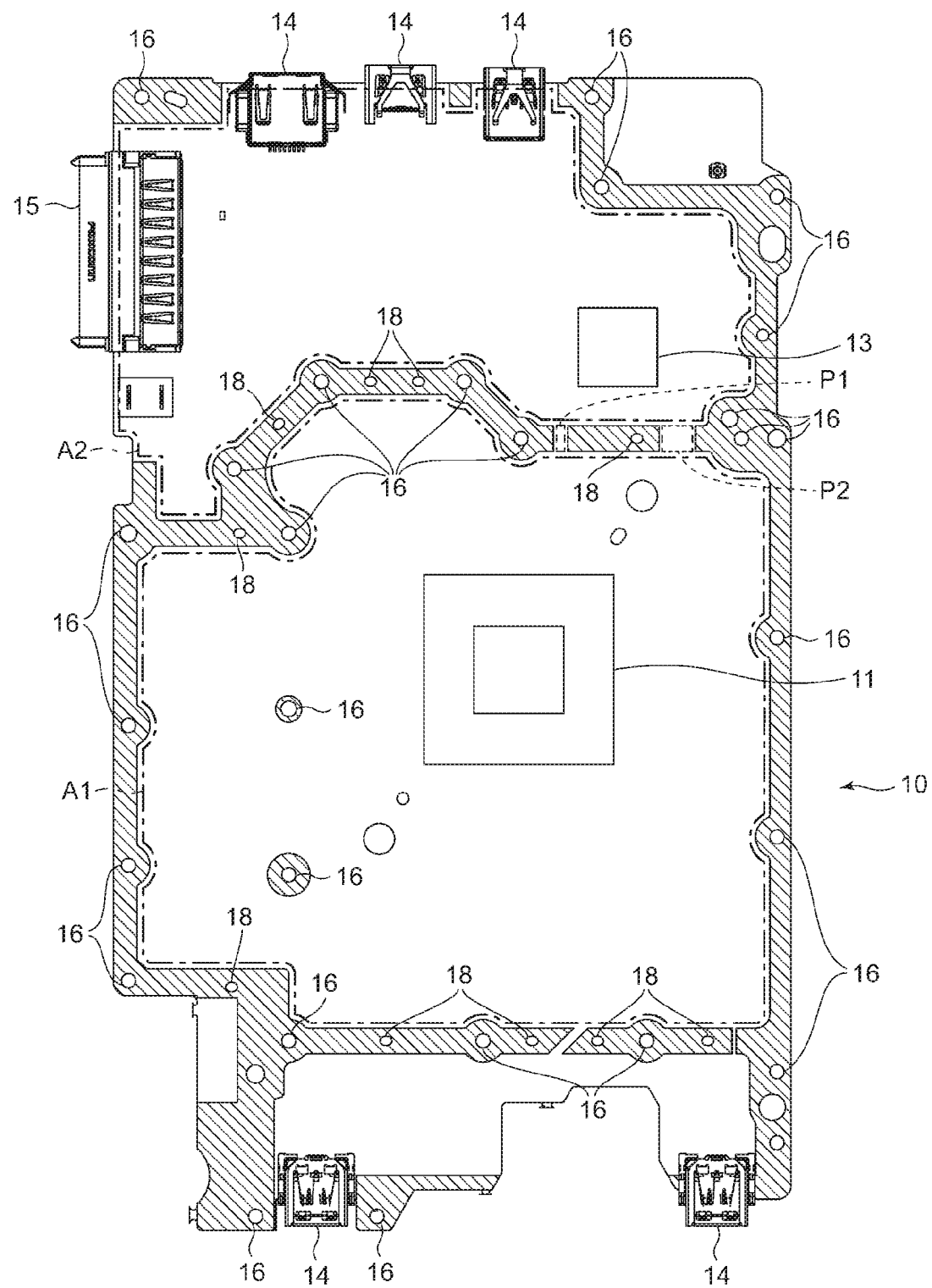
FIG. 9 is a plan view of a printed board incorporated in electronic equipment according to a modification example of the present disclosure.
Figure 10:
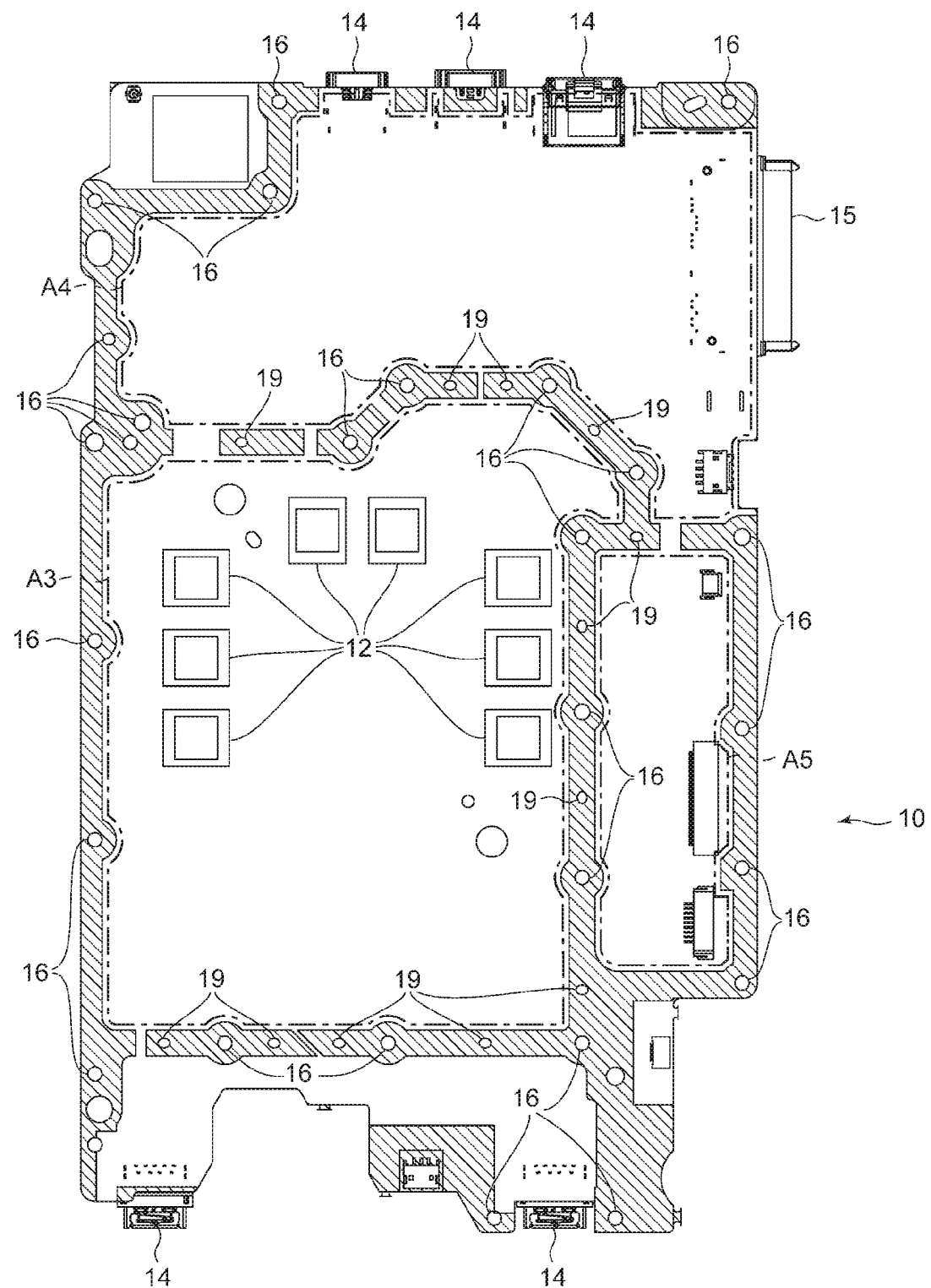
FIG. 10 is a bottom view of the printed board incorporated in the electronic equipment according to the modification example of the present disclosure.
Figure 11:
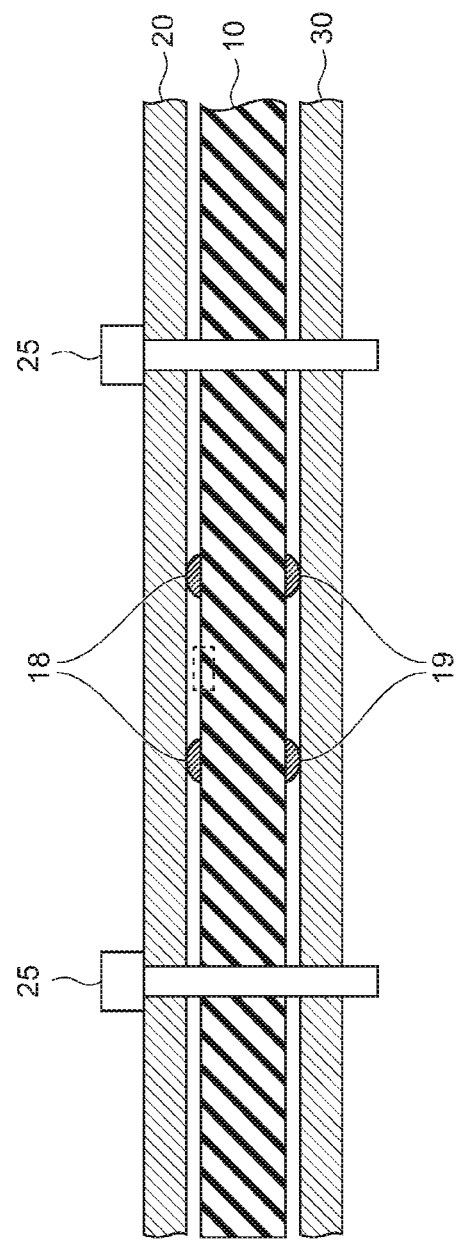
FIG. 11 is a diagram for explaining the structure of protruding parts provided on the printed board in the modification example of the present disclosure.

FIG. 9 is a plan view depicting one example of the front surface of the printed board 10 on which the protruding parts 18 in this modification example are disposed. Furthermore, FIG. 10 is a bottom view depicting one example of the back surface of the printed board 10 on which the protruding parts 19 are disposed. FIG. 11 is a diagram depicting the state in which the protruding part 18 and the protruding part 19 are each electrically connected to the opposed shield member, and is a partial sectional view schematically depicting appearance when the printed board 10 to which the upper shield member 20 and the lower shield member 30 are fixed is cut along a direction that is perpendicular to the front surface of the printed board 10 and is parallel to the extension direction of the ground pattern similarly to FIG. 8. Similarly to FIG. 7 and FIG. 8, the size and position of each component are different from the actual size and position also in this FIG. 11. As depicted in these diagrams, by providing the protruding parts 18 and the protruding parts 19 at positions sandwiched between adjacent two screw holes 16 in plan view, the ground patterns of the printed board 10 can be surely brought into contact with the respective shield members not only at the positions of the screw holes 16 but also at the positions of these protruding parts 18 and protruding parts 19.

In the example of FIG. 11, two protruding parts 18 are disposed between the adjacent two screw holes 16. In this example, a place depicted by a dashed-line rectangle in the diagram represents a position at which the ground pattern is divided. The two protruding parts 18 are disposed to sandwich this position of dividing. This causes noise to propagate from the position at which the ground pattern is divided to the external less readily. Furthermore, two protruding parts 19 are disposed at positions that overlap with the protruding parts 18 in plan view similarly to the example of FIG. 8.

Moreover, in the above description, it is assumed that the electronic equipment is a game machine for home use. However, the electronic equipment according to the embodiment of the present disclosure is not limited thereto and may be various kinds of equipment incorporating a printed board on which a circuit element that generates noise is mounted, such as personal computers, portable game machines, and smartphones.

The present disclosure contains subject matter related to that disclosed in Japanese Priority Patent Application JP 2017-041544 filed in the Japan Patent Office on Mar. 6, 2017, the entire content of which is hereby incorporated by reference.

It should be understood by those skilled in the art that various modifications, combinations, sub-combinations and alterations may occur depending on design requirements and other factors insofar as they are within the scope of the appended claims or the equivalent thereof.

What is claimed is:
1. Electronic equipment comprising:
a printed board having a front surface on which a ground pattern is formed; and
a shield member being formed of a conductive material defining a plate having first and second spaced apart surfaces, and being disposed such that the first surface is in opposition to the front surface of the printed board, wherein:
the shield member has one or more strip-shaped regions, each of which is opposed to the ground pattern of the printed board, protrudes toward and electrically contacts the ground pattern of the printed board,
a given one of the one or more strip-shaped regions includes a plurality of screw holes that extend between the first and second spaced apart surfaces of the plate, and the given one of the one or more strip-shaped regions is fastened to the printed board by a plurality of screws, each of which pass through a respective one of the plurality of screw holes in a direction from the second surface of the plate, through the plate, and away from the first surface of the plate toward the printed board, and
at least one of the shield member and the ground pattern of the printed circuit board includes at most two protruding parts that are located between any two adjacent screw holes among the plurality of screw holes, the at most two protruding parts project from the at least one of the first surface of the plate toward the printed board, and the ground pattern of the printed circuit board toward the shield member, and causes the given one of the one or more strip-shaped regions and the ground pattern to electrically contact each other at a portion of the ground pattern of the printed board having no screw holes,
wherein the at most two protruding parts are formed at respective positions in such a manner as to sandwich a place at which the ground pattern is divided.
2. The electronic equipment according to claim 1, wherein distance between the at most two protruding parts in plan view and a distance between one of the screw holes and one of the at most two protruding parts in plan view are equal to or shorter than 20 mm.

3. The electronic equipment according to claim 2, wherein the distance between the at most two protruding parts in plan view and the distance between the one of the screw holes and the one of the protruding parts in plan view are equal to or shorter than 15 mm.

4. The electronic equipment according to claim 1, wherein respective lengths of the at most two protruding parts along an extension direction of the strip-shaped region is equal to or shorter than 3 mm.

5. The electronic equipment according to claim 1, wherein
the printed board has a first region and a second region, within each of which a respective circuit element is disposed on the front surface of the printed board,
the ground pattern is formed at a boundary part between the first region and the second region, and
the plate of the shield member has a first part opposed to the first region and a second part opposed to the second region, and the strip-shaped region is formed at a boundary part between the first part and the second part.

6. The electronic equipment according to claim 1, further comprising a further shield member being formed of a conductive material defining a further plate having first and second spaced apart surfaces, and being disposed such that the first surface is in opposition to a rear surface of the printed board.

7. The electronic equipment according to claim 6, wherein the further shield member includes at most two further protruding parts that: (i) are located opposite to the at most two protruding parts of the shield member, and (ii) project from the first surface of the further plate toward the rear side of the printed board.

* * * * *